United States Patent [19]

Stewart et al.

[11] Patent Number: 4,589,547
[45] Date of Patent: May 20, 1986

[54] CARRIER FOR STACKED SEMICONDUCTOR DIE

[75] Inventors: Timothy C. Stewart, Scottsdale; Leo Ofman, Glendale; Kelvin R. Blair, Tempe; Randolph M. Gregg, Mesa, all of Ariz.

[73] Assignee: Motorola Inc., Schaumburg, Ill.

[21] Appl. No.: 458,072

[22] Filed: Jan. 14, 1983

[51] Int. Cl.[4] .............................................. B65D 73/02
[52] U.S. Cl. .................... 206/328; 220/4 E; 206/521; 206/518
[58] Field of Search ............... 206/328, 334, 521, 518, 206/499; 220/4 E

[56] References Cited

U.S. PATENT DOCUMENTS

| | | | |
|---|---|---|---|
| 2,800,945 | 7/1957 | Schilling | 220/4 E |
| 2,858,014 | 10/1958 | Koziol | 220/4 E |
| 2,899,050 | 8/1959 | Collins, Jr. | 206/328 |
| 3,048,668 | 8/1962 | Weiss | 206/328 |
| 4,346,817 | 8/1982 | Karcher | 206/328 |
| 4,353,481 | 10/1982 | Tando | 206/328 |
| 4,359,157 | 11/1982 | Horstmann | 206/328 |

Primary Examiner—Joseph Man-Fu Moy
Attorney, Agent, or Firm—Robert M. Handy

[57] ABSTRACT

A carrier (30) for thin flat electronic devices (36) is provided which has a high volumetric efficiency and is adapted for use with automatic handling equipment. The carrier (30) comprising a hollow tube (31) having a longitudinal interior bore (35) in which is placed a longitudinal cage of metal rails (38) which surround, guide, and hold the devices (36) in a stacked relationship. At least six rails (38) are required to avoid binding and jamming of devices (36) in bore (35). End caps (33a–b) and a moveable resilient plug (34) are used to retain the devices (36) firmly but gently in place to prevent chipping and scratching of the devices (36) during handling and shipment of the carrier (30), and to vary the capacity of the carrier (30). The carrier (30) is rugged, reuseable, and has a volumetric efficiency (devices/unit volume) three to eighteen times higher than prior art eggcrate type device carriers.

3 Claims, 14 Drawing Figures

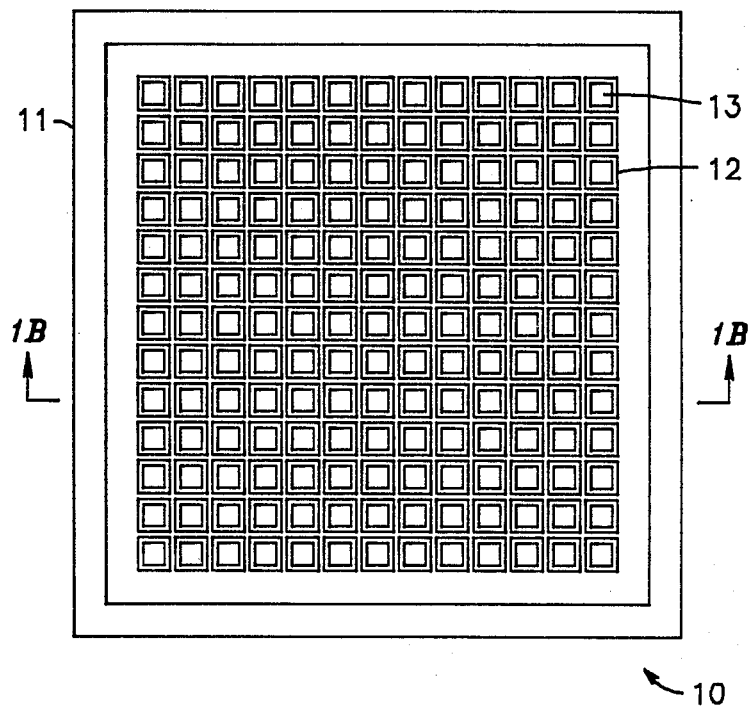
FIG. 1A — PRIOR ART —
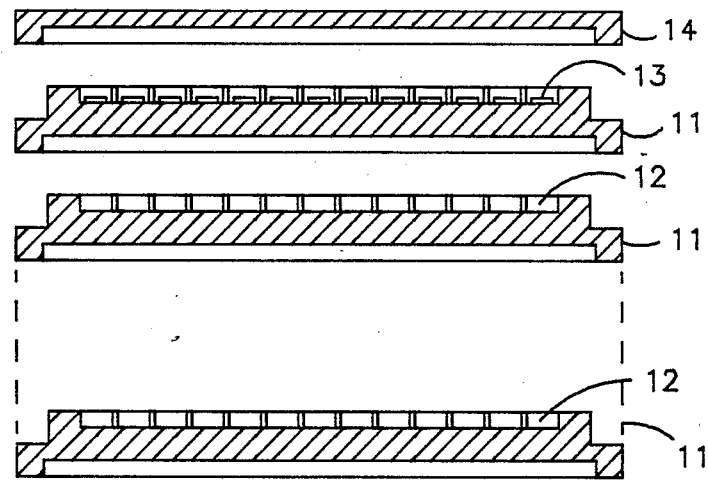
FIG. 1B — PRIOR ART —

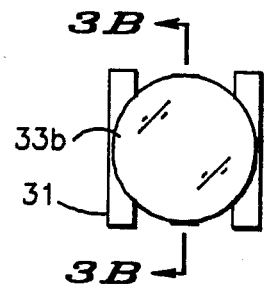
FIG. 3C
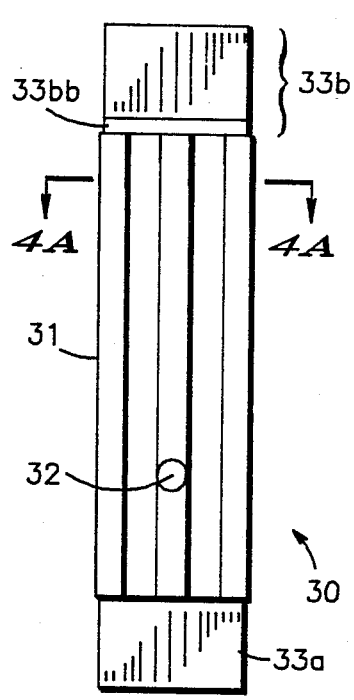
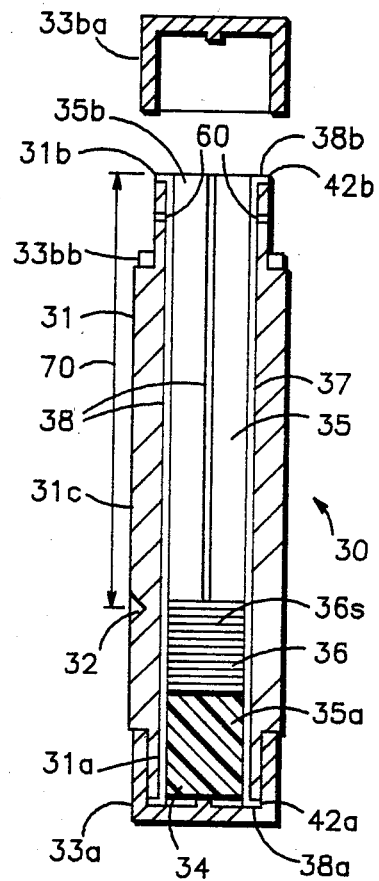
FIG. 3A  FIG. 3B

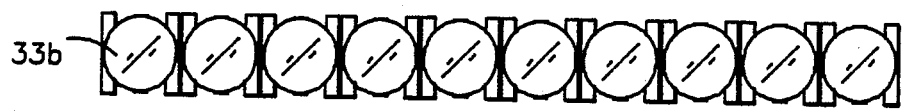
FIG. 5A
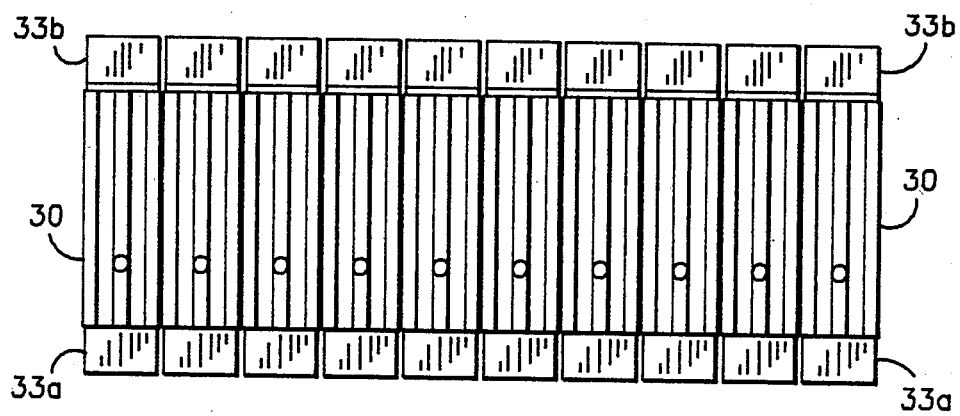
FIG. 5B
FIG. 6B
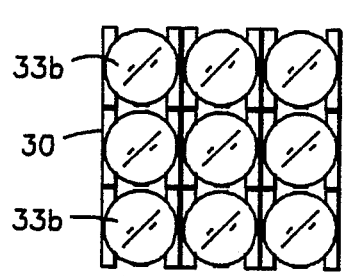
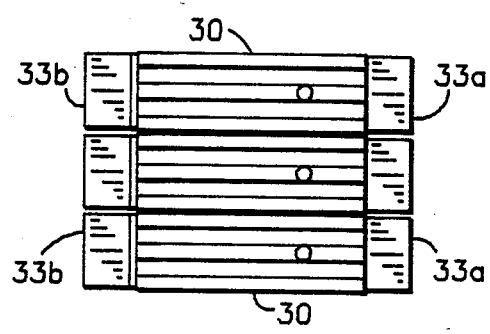
FIG. 6A

CARRIER FOR STACKED SEMICONDUCTOR DIE

BACKGROUND OF THE INVENTION

1. Field of the Invention

This invention relates in general to improved carriers for electronic devices and, more particularly, to improved carriers for holding semiconductor die in a stacked relationship.

2. Background Art

Many electronic devices, particularly semiconductor devices, are manufactured in wafer form and then cut apart into individual die. The good die are picked out and the balance discarded. The good die are then bonded into individual packages or mounted directly onto ceramic or plastic circuit boards and/or tapes. It is frequently the case that wafer fabrication is carried out in one manufacturing location while die bonding and other assembly operations are carried out in a geographically separated location, sometimes even by a different company. Accordingly, large number of semiconductor die must be transported over large distances between the wafer manufacturing locations and the assembly locations. Since the semiconductor die are both fragile and expensive, the development of reliable and convenient shipping and handling containers is a matter of great commercial significance. These shipping and handling containers are generally referred to as die carriers.

Two general types of die carriers have been used in the prior art. The first involves a plastic tray which contains a large number of shallow depressions, much like an egg crate with flat bottomed compartments. One die is placed in each compartment and the plastic tray is covered with a lid. The die are generally loose within the compartment so that some jostling of the die takes place during handling and shipment. This jostling can result in chipping, scratching, or other defects. The second die carrier scheme utilizes an adhesive coated plastic tape or other tacky surface to which the die are stuck. The sticky or tacky-tape usually forms the bottom of a shallow dish. Once the die are in place, a protective cover is provided. Compartments are not needed with the tacky-tape type of container and, in general, the die do not move relative to the container during handling and shipment.

These prior art methods have a number of deficiencies, for example:

(1) the volumetric efficiency of these packing arrangements is poor. The die are separated laterally within the carrier, and even though the carriers may be stacked one upon the other the number of die per unit volume is low.

(2) the tacky-tape cannot be reused and must be discarded after shipment.

(3) the egg crate carriers, even though reusable, are bulky and expensive to ship back to the point of origin;

(4) these prior art carriers are difficult and/or expensive to mate with automated assembly equipment. The lateral separation of the die in the carriers requires that either the carrier or the die pick-up arm be repositioned as each die is removed. Thus, an additional two-dimensional translational motion must be provided in the handling and assembly equipment in addition to that ordinarily required for the loading, unloading, and assembly operations themselves. A further complication with respect to automated assembly is that neither the egg crate carrier nor the sticky tape carrier provides a reliable positional reference or die-to-die spacing. As a consequence the handling and assembly equipment must be able to accommodate a substantial variation in the individual die positions during loading, unloading, and assembly. This increases the cost of such equipment. Thus, a need continues to exist for improved handling and shipping containers for electronic devices, particularly semiconductor die carriers, which overcome these and other deficiencies of the prior art.

Accordingly, it is an object of the present invention to provide an improved handling and shipping container for electronic devices, especially an improved carrier for semiconductor devices, which is rugged, easily shipped, and inexpensive to manufacture and use.

It is a further object of the present invention to provide an improved carrier for electronic devices, which holds the devices firmly but gently during shipment to avoid jostling and which is completely reuseable.

It is an additional object of the present invention to provide an improved carrier for electronic devices which has a large and variable capacity, which is compact, and which has a high volumetric efficiency.

It is a further objective of the present invention to provide an improved carrier for electronic devices which is easy to load and unload, and which is particularly adapted for use with automated loading and unloading equipment, and with automated assembly equipment.

SUMMARY OF THE INVENTION

These and other objects and advantages are achieved through the present invention wherein there is provided a carrier for holding electronic devices, especially semiconductor die and the like, in a stacked relationship, comprising a hollow tube having a longitudinal interior bore of a cross-sectional extent larger than the device and at least six longitudinal rails for guiding and positioning the devices in a stacked relationship within the bore, these rails being mounted on or formed in or on the interior surface of the bore so as to protrude from the interior surface into the bore. There is further provided an orientation means which permits one end of the hollow tube to be identified and, if desired, oriented in a particular direction and at a predetermined distance from a reference position, such as, a loading, unloading, or assembly station. There is further provided a moveable interior plug located within the bore for supporting the devices and changing the interior length of the bore between the plug and a first end through which loading and unloading proceed, in order to accommodate within the carrier differing numbers of devices and maintain a firm but gentle pressure on the devices to preclude jostling. Enclosure means, such as, press fit caps are conveniently used for containing the devices within the hollow bore during handling and shipment. The hollow tube also conveniently contains one or more indicator means, such as, an open, transparent, or translucent portion in a sidewall of the hollow tube so that the presence or absence of varying number of devices within the hollow tube may be readily determined. Tubes having different size and shape of the interior bore are provided to accommodate devices of different size and shape. The use of at least six spaced apart guide rails is important to avoid binding, sticking, and chipping of semiconductor die.

BRIEF DESCRIPTION OF THE DRAWINGS

FIGS. 1A–B show, respectively, a top view and a side cross-sectional view of an egg-crate type die carrier, according to the prior art.

FIGS. 3A–C show, respectively, a side view, a cross-sectional view, and a top view of an improved device carrier according to the present invention.

FIG. 4B is an enlargement of a portion of FIG. 4A.

FIGS. 5A–B show, in schematic form, a top view and side view respectively, of a linear array of device carriers according to the present invention.

FIGS. 6A–B show, in schematic form, a top view and side view respectively, of a rectangular array of device carriers according to the present invention.

DETAILED DESCRIPTION OF THE PREFERRED EMBODIMENT

Figure 2A:
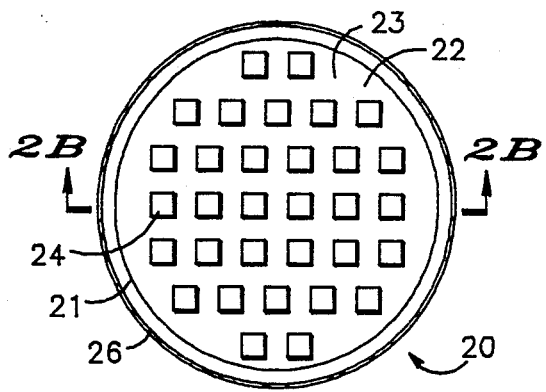
FIGS. 2A–B show, respectively, a top view and a side cross-sectional view in schematic form of a tacky-tape type die carrier, according to the prior art.

FIG. 1A shows a top view of egg-crate type carrier 10, according to the prior art, with the lid removed. Plastic tray 11 has a multiplicity of shallow separate compartments 12 in which are placed electronic devices 13. FIG. 1B shows an exploded cross-sectional view of a stack of several die carriers 10 of FIG. 1A. For clarity only a portion of compartments 12 are shown as containing die 13. As illustrated in FIG. 1B, plastic trays 11 are designed to stack so that each forms a lid for the one below. The stacked trays retain devices 13 within compartments 12 and protect devices 13 during shipment. Only the uppermost tray requires separate lid 14. Egg-crate type device carrier 10 is commonly used for the shipment of semiconductor die, but serves equally well for other types of electrical devices of a size and shape to fit within compartments 12. The larger the device, the larger the compartment, and the fewer the compartments and devices which can be accommodated within a carrier of fixed outside dimensions. For ease of loading and unloading, compartments 12 are arranged to be somewhat larger than devices 13. Thus, some jostling of devices 13 occurs within compartments 12 during shipment. This can result in scratching and chipping of devices 13.

Figure 2B:
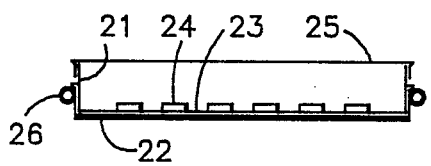

FIGS. 2A–B show, respectively, a top view with the lid removed, and a side cross-sectional view of tacky-tape type die carrier 20, according to the prior art, in which electrical devices 24 are placed on tacky surface 23 of plastic tape 22. Plastic tape 22 is stretched over cylindrical hoop or ring 21 and held in place by clamp ring 26. Lid 25 is provided to seal carrier 20 during shipment. Since devices 24 adhere to tacky surface 23, there is no jostling of devices 24 within carrier 20 during shipment.

FIGS. 3A–C illustrate an improved carrier according to a preferred embodiment of the present invention, wherein carrier 30 is composed of hollow tube 31 having longitudinal interior bore 35 closed off by moveable plug 34 and removeable end caps 33a–b. Other means of closing or blocking the ends of hollow tube 31 can also be used. Electronic devices 36, for example semiconductor die, are loaded in a stacked relationship within bore 35. Rails 38 are arranged longitudinally, that is, along the length of bore 35 so as to protrude slightly from interior surface 37 of bore 35. Rails 38 serve to confine and guide devices 36. While carrier 30 is particularly convenient where devices 36 are semiconductor die, it is also useful with other types of devices which have a generally flat shape so as to be amenable to stacking in bore 35. FIG. 3A shows a side view, FIG. 3B a cross-sectional view, and FIG. 3C a top view of carrier 30.

Figure 4C:
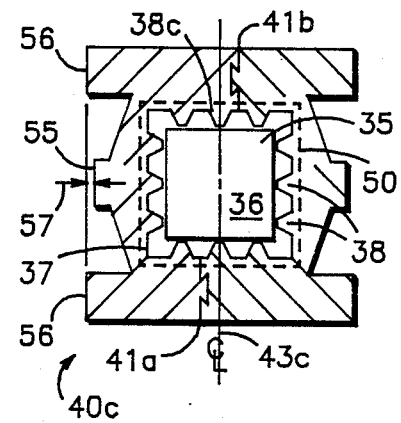
FIGS. 4A–C show cross-sectional views of the device carrier of FIGS. 3A–C, according to several embodiments.
Figure 4B:
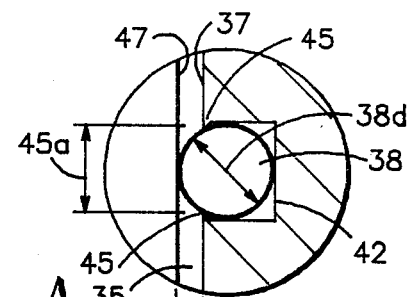
Figure 4A:
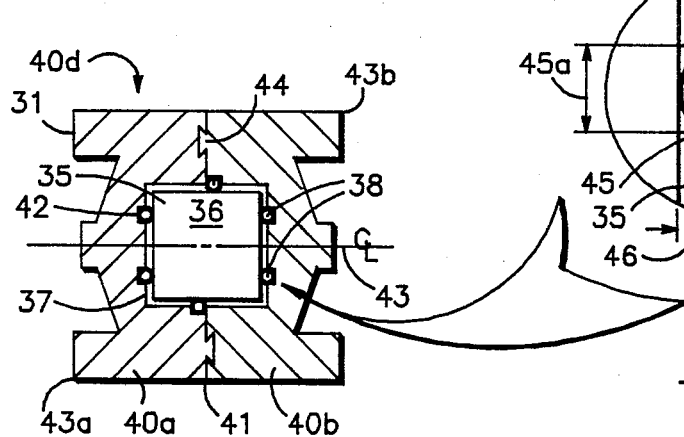

The relationship between bore 35, devices 36, and rails 38 can be more clearly understood by reference to FIGS. 4A–C which show cross-sectional views of several embodiments of carrier 30 of FIG. 3A. In FIGS. 4A–C, rails 38, at least six in number, are placed within bore 35 so as to protrude from interior surface 37 of bore 35. Rails 38 are distributed approximately uniformly around the interior circumference of bore 35 so as to make a longitudinal cage for enclosing and guiding devices 36.

A variety of different arrangements of rails 38 surrounding devices 36 are possible. For example, if one rail is placed in each of the four faces of rectangular bore 35, these four rails are geometrically sufficient to locate and guide devices 36. However, it was discovered that, with only four rails in bore 35, devices 36 had a much greater propensity to rotate and/or tilt, and that they wedged or jammed within bore 35. While three rails are theoretically sufficient to position or guide round devices and four rails are theoretically sufficient for rectangular devices, it was discovered that at least six rails were required to reliably guide and locate rectangular devices so that jamming or sticking of devices 36 was substantially avoided. While more than six rails can be utilized, it is believed that little benefit is gained beyond twelve rails. A smooth bore corresponds to an infinite number of rails.

When no rails were provided, that is, when a smooth plastic bore was used, tests showed that the devices also had a much greater propensity to become wedged and jammed, as compared to the six rail carrier. Carriers in which the entire bore was lined with smooth metal sheets, so as to provide a wear and gouge resistant continuous inner surface facing the die, also exhibited substantial wedging and jamming of the die. It was difficult to keep the smooth metal sheets flat. In summary, it was observed that when too few rails (i.e. less than 6) or too many rails (e.g. a smooth bore) were used, wedging and jamming occured. Six to twelve rails are preferred. It is important that rails 38 be made of metal to resist wear or gouging by the edges of devices 36 and to provide a smooth surface of limited contact area for guiding devices 36 in and out of bore 35.

Hollow tube 31 may be made of a variety of different materials, and formed in one or several pieces. It is convenient to fabricate hollow tube 31 in two halves 40a–b which are subsequently connected together at joint 41, as illustrated in cross-section 40d of FIG. 4A. It is apparent from FIG. 4A that left-hand portion 40a and right-hand portion 40b of hollow tube 31 are symmetrical, that is, that portions 40a and 40b have the same cross sectional shape and can be produced by the same molding tool. That this is so can be seen by taking cross-sectional portion 40a and rotating it, first around joint 41 and subsequently around line 43, so as to transfer corner 43a to location 43b. Interlocking tab and groove (or cavity) 44 are optionally provided so that halves 40a–b may be snapped or slid together, i.e. be self-locking.

In order that die carrier 30 be both lightweight and inexpensive, it is desirable that tube 31 be molded or extruded from plastic. Rails 38 can be molded into the plastic or notches 42 can be provided to locate metallic rails 38. Rails 38 can be retained in notches 42 by means of a press fit, an adhesive, bent-over portions, or a combination thereof. For ease of fabrication of carrier 30 and also to provide a smooth transition into the interior of bore 35, rails 38 are conveniently formed from metal wires having bent-over portions 38a–b at their extremities which fit into matching notches or holes 42a–b in hollow tube 31 (see FIG. 3B). Bent over portions 38a–b also serve to retain rails 38. It is desirable that rails 38 be in tension. This helps to keep rails 38 straight so that the interior clearance between rails 38 and die 36 is substantially constant. This is conveniently accomplished by making the longitudinal distance between bent-over portions 38a–b slightly less than the longitudinal distance between holes or notches 42a–b. When the parts are assembled, rails 38 are thus pulled taut.

If notches 42 also have lips or edges 45 which provide opening 45a at surface 37 slightly smaller than cross-section, e.g. diameter, 38d of rails 38, then rails 38 will also snap into and be retained by notches 42 along their length. This is illustrated in FIG. 4B where the clearance between rails 38 and notches 42 has been exaggerated for clarity. While this feature is desirable, it is not essential so long as rails 38 are otherwise retained uniformly in notches 42.

Rails 38 must protrude into bore 35 from sidewall 37 by distance 46 sufficient to insure that the corners or edges 47 of die 36 do not touch sidewalls 37. This is important when tube 31 is made of a comparatively soft plastic which could be gouged by devices 36. Gouging increases jamming and sticking. As noted earlier, smooth bore tubes without rails did not work satisfactorily, even when lined with hard materials such as metals, since substantial wedging, jamming, and sticking occurs.

FIG. 4C illustrates another embodiment of carrier 30 of the present invention in which rails 38 are molded-in or formed integrally in or on surface 37 of bore 35. This arrangement is particularly convenient when tube 31 is formed from metal or comparatively hard, i.e. gouge resistant materials. In that case, rails 38 are formed directly as a part of the material of tube 31. Alternatively, portion 50 of tube 31 containing rails 38, and indicated by the dotted lines in FIG. 4C, can be a hard insert, e.g. a metal, ceramic, or hard plastic, while the balance of tube 31 is of a softer material such as a soft plastic. By way of example, twelve rails are shown in FIG. 4C. Joint line 41a–b is desirably located slightly off center line 43c of cross-section 40c so as to intersect surface 37 between rails 38. Alternately, joint line 41a–b can be on centerline 43c and center rails 38c slightly displaced.

Returning now to FIGS. 3A–C, end cap or end means 33b is shown in a removed position in FIG. 3B to illustrate how carrier 30 is opened so that die 36 may be loaded or unloaded from end 35b of bore 35. End cap 33a can be similarly removed. Plug 34 has been inserted in end 35a of bore 35. It is convenient that end cap 33b be formed in two portions, a first cap portion 33ba which is ordinarily removed to fill or empty carrier 30, and a second ring portion 33bb which remains on carrier 30 when cap portion 33ba is removed. Different colored end caps 33a–b are used for each different bore size. Colored ring portion 33bb allows the bore size to be identified even when both end caps have been removed.

Plug 34 is moveable and is conveniently formed of an elastomeric material so as to provide a friction fit within bore 35 and a resilient support for devices 36. When bore 35 has been filled with the desired number of devices 36, plug 34 is advanced in the direction of open end 35b of bore 35 until any empty space remaining within bore 35 between die 36 and end 35b is substantially removed. When end cap 33b is in place over end 35b, plug 34 can be moved until devices 36 are snugly retained between end cap 33b and plug 34. Plug 34 may be advanced or retracted conveniently through end 35a of bore 35. Plug 34 may be advanced before, after, or while devices 36 are inserted or removed through end 35b of bore 35. When plug 34 is used, cap 33a is not needed to retain devices 36 within bore 35, but cap 33a conveniently serves to exclude dust and contamination. Other means of blocking ends 35a–b can also be used. The combination of the longitudinal cage formed by rails 38 and the pressure exerted on the ends of the stack of devices 36 by end caps 33a–b and plug 34, serve to retain devices 36 within hollow tube 31 so that there is substantially no motion or jostling of devices 36 within bore 35 during handling and shipment of carriers 30. This overcomes the jostling deficiency of the egg-crate type carriers of the prior art. At the same time, being able to stack the devices rather than just the carriers, significantly increases the volumetric efficiency of the invented carrier relative to the prior art. This is a significant advantage. Scratching between the faces of the stacked devices is not generally troublesome because rails prevents significant lateral motion of one device against its mate. If the devices have particularly fragile surfaces, thin protective separator 36s can be inserted between each device.

A particular feature of the present invention is that devices 36 may be ejected from carrier 30 by means of plug 34 or a push-rod inserted through end 35a, without having to individually locate and lift each device, as in the prior art carriers. As the stack of devices 36 is raised by upward motion of plug 34, each device successively arrives at the same exit position i.e. end 35b of bore 35. Thus when tube 31 is held in a fixed position, each device is automatically delivered to a fixed and known location for transfer to the next manufacturing step. This is especially convenient in connection with automated handling equipment.

There is further provided optional index marker 32 in tube 31 which by its position closer to one end, in this case end 31a, provides a ready identification of the end containing plug 34 and/or end 35b through which loading or unloading of devices 36 is to take place. This is important in that it allows the user to insert a full or empty carrier in a loading, unloading or handling machine in a predetermined orientation so the devices may be loaded and unloaded from a predetermined position with the upper surface of the devices facing in a known direction. This is of great manufacturing convenience and is of particular importance when use of the carrier in connection with automatic loading, unloading, or handling machinery is contemplated.

It will be apparent from FIGS. 3A–C, that index marker 32 also provides a reference location which is a fixed distance 70 from end 31b of tube 31. Index marker 32 also provides an angular or rotational orientation reference about the axis of bore 35. This is useful in arranging to load (and unload) devices such that their rotational orientation is known or fixed with respect to orientation indicator 32. Having a fixed and reliable index point is particularly important in connection with automatically positioning carrier 30 with bore end (exit) 35b in a known location, and with presenting die at exit 35b having a predetermined rotational orientation to facilitate automatic placement of the die in the proper orientation for die bonding. As used herein, the words "orientation means" are intended to include index markers which provide an index point or orientation indicator with respect to both translational and rotational positioning of the device carrier.

It is desirable that end portions 31a-b of hollow tube 31 have a circular exterior cross-section while central portion 31c of hollow tube 31 has a rectangular cross-section, as is illustrated in FIGS. 3A-C and FIG. 4A-C. The circular cross-section at ends 31a-b is convenient for the ready attachment and removal of end closure means or caps 33a-b.

The rectangular cross-section of central portion 31c of hollow tube 31 is desirable in that it permits several carriers to be easily stacked in a linear arrangement, as illustrated in FIGS. 5A-B or in a rectangular arrangement as in FIGS. 6A-B. These arrangements are convenient for packing as well as installation in automated handling machinery and provide a high volumetric efficiency compared to the prior art carriers. Thus, the carrier of the present invention not only has a high volumetric efficiency individually but also when grouped for bulk handling and shipment. FIG. 5A is a top view and FIG. 5B a side view of a linear array of carriers 30. FIGS. 6A-B are, respectively, a top view and side view of a rectangular array of carriers 30. In FIGS. 5A-B and 6A-B, end caps 33a-b are shown installed. It is convenient for ease of packing and handling that tube 31 have a square cross-section even though devices 36 are not square, i.e. are rectangular or circular.

Examples of device carrier 30 according to the present invention, were constructed with an overall length of tube 31 of about 2.0 inches (5.1 cm), a square central portion 31c of exterior width dimensions of about 0.5 by 0.5 inches (1.27 by 1.27 cm), and bore 35 of from 0.11 by 0.11 inches (0.28 cm by 0.28 cm) to 0.24 by 0.24 inches (0.61 by 0.61 cm). Rails 38 were about 0.02 inches (0.05 cm) in diameter and extended the length of bore 35. Different bore sizes are used to accommodate different die sizes. Rails 38 are conveniently made of stainless steel. Rails 38 protrude from surface 37 of bore 35 by typically about 0.005 inches (0.013 cm), so that they form a substantially rectangular cage of interior dimensions of from 0.1 by 0.1 inches (0.25 by 0.25 cm) to 0.23 by 0.23 inches (0.58 by 0.58 cm), which size is useful to accommodate semiconductor die (e.g. devices 36) of dimensions typically from about 0.09 by 0.09 inches (0.23 by 0.23 cm) to 0.21 by 0.21 inches (0.53 by 0.53 cm). Sufficient clearance, for example, about 0.01 inches (0.025 cm), must be provided between rails 38 and devices 36 to allow for normal variations of −0.001 to +0.004 inches (−0.0025 to +0.01 cm) in the size of devices 36. The carriers of the present invention have an aspect ratio (i.e. length to width ratio) of about 6 to 1 and preferably less than 20 to 1. Within this range they are quite stiff and resist bending. This avoids damage to the devices therein. The square tubular shape of carrier 30 makes it particularly rugged.

The improvement in volumetric efficiency of the present invention as compared to the prior art carriers can be readily determined for several different size die. A typical prior art egg-crate type carrier measures approximately 4×4×⅜inch (10.2×10.2×0.95 cm) and has between 144 and 576 die compartments, depending upon die size. Since the carriers nest, the volumetric efficiency depends upon how many carriers are stacked together. The effective volume per carrier is given by $V_{eff} = (4.74N + 2.26)/N$, inches$^3$, where N is the number of nested carriers. The volumetric efficiency VE(N) is given by $VE(N) = n/V_{eff}$ where n is the number of die per nested carrier, that is, $VE(N) = Nn/(4.74N + 2.26)$, die/inch$^3$.

These relations are evaluated in Table I for a single prior art die carrier with a lid and for a stack of ten prior art die carriers with a lid. The stack of ten prior art die carriers gives a cube-like shape of slightly over four inches (10.2 cm) on a side which achieves 95 percent of the maximum possible volumetric efficiency for such prior art carriers. The capacity and volumetric efficiency of the prior art carriers are substantially independent of die thickness in the thickness ranges of interest (e.g. 6-10 mils; 0.15-0.25 mm), but depend on the lateral die size.

The carrier of the present invention has a nominal capacity of about 200 die of 8 mil (0.2 mm) thickness and 333 die of 6 mil (0.15 mm) thickness, while still leaving room for end caps 33a-b and plug 34. The number will be slightly larger or smaller depending on the length of plug 34. If plug 34 is omitted approximately 200 die of 10 mil (0.025 mm) thickness can be accommodated. Capacity increases or decreases as die thickness decreases or increases, but is independent of lateral die size. The carrier of the present invention fits within a volume of 0.5×0.5×2.25 inches (1.3×1.3×5.7 cm), that is, 0.56 inches$^3$ (9.2 cm$^3$), and has a constant volumetric efficiency of 357 die/inches$^3$ (21.8 die/cm$^3$) for a typical 8 mil (0.2 mm) thick die. The volumetric efficiency of the carrier of the present invention is independent of the number of carriers packaged together since nesting is not required. The volumetric efficiency of 357 die/inches$^3$ (for 8 mil die) is achieved even if only one carrier is used. Table I shows the volumetric efficiency in die/inches$^3$ of a prior art 4×4×⅜inch egg-crate carrier, for one and ten nested carriers i.e. VE(1) and VE(10), and for different die of square sizes from 92 to 210 mils (0.23 to 0.53 cm). Also shown are the ratios R(1) and R(10) obtained by dividing the volumetric efficiency of the carrier of the present invention (357 die/inches$^3$) by the volumetric efficiency values for the prior art carrier, VE(1) and VE(10) respectively, so that the improvement can be readily appreciated.

TABLE I

| Comparison of Volumetric Efficiency in Die Per inches$^3$ For 8 Mil Thick Square Die of Different Lateral Size | | | | | |
|---|---|---|---|---|---|
| Lateral Die Size (mils) | Die Per carrier (Prior Art) | VE(1) (Prior Art) | R(1) | VE(10) (Prior Art) | R(10) |
| 210 | 144 | 20.6 | 18.0 | 29.0 | 12.7 |
| 180 | 196 | 28.0 | 13.3 | 39.5 | 9.4 |
| 150 | 256 | 36.6 | 10.1 | 51.6 | 7.2 |
| 120 | 361 | 51.6 | 7.2 | 72.7 | 5.1 |
| 92 | 576 | 82.3 | 4.5 | 116.0 | 3.2 |

It is apparent from Table I that the carrier of the present invention provides a volumetric efficiency (die/unit volume) which is a factor of 3.2 to 18.0 times greater than the prior art egg-crate carriers. In general, egg-crate type carriers have equal or higher volumetric efficiency than tacky-tape type carriers, so the present invention will have the same or greater improvement over these types of carriers as well.

Thus, it is apparent that there has been provided in accordance with this invention an improved carrier for electronic devices, particularly semiconductor die, which is rugged, easily shipped, and inexpensive to manufacture and use. It is further apparent that the improved carrier for electronic devices of the present invention holds the devices or semiconductor die gently but firmly during shipment to avoid jostling. The improved device carrier is reuseable. It is additionally apparent that the device carrier of the present invention has a large and variable capacity but is nevertheless compact and has a high volumetric efficiency. It is further apparent that the improved carrier of the present invention is easy to load and unload, and is particularly adaptable for use with automated handling and assembly equipment.

While the invention has been described in terms of certain recommended materials and shapes, it will be apparent to those of skill in the art that the invented structure is useful with other shapes and a variety of electronic devices such as, semiconductor die, bubble memory chips, Josephson devices, ceramic based thin film circuits, and other electronic devices having substantially a thin flat shape. It will also be apparent that a variety of different methods may be used for indicating a predetermined orientation of the carrier and for providing thereon a reference position at a predetermined location.

When a plastic material that is transparent or translucent is used for hollow tube 31 then the degree of fill of bore 35 may be readily determined by inspection. To facilitate viewing (see FIG. 4C), central face 55 of portion 31c of carrier 30 is relieved so as to lie inside a line drawn between peripheral faces 56 of carrier 30 by amount 57. This has the effect of substantially reducing scratching and/or abrasion of face 55 which would otherwise occur during handling of carrier 30. As a consequence the useful life and utility of carrier 30 is improved.

Where it is desirable to use an opaque material for tube 31, then one or more viewing windows, slots, or openings can be provided in tube 31 so that the degree of fill may be readily ascertained. For example, openings 60 are provided to permit an optical sensor to count the number of devices 36 falling past openings 60 as devices 36 are loaded into bore 35. Openings 60 lie between rails 38 so as to have an unobstructed view through bore 35. Alternatively, end cap 33a may be omitted and plug 34 may be of greater length so as to protrude from end 31a of tubes 31, the degree of protrusion being inversely proportional to the degree of fill of bore 35.

These and other variations may be included which differ in detail but preserve the central relationships among the various elements of the present invention. Accordingly, it is intended to encompass all such variations as fall within the scope of the invention.

We claim:

1. A semiconductor die carrier for moveably holding semiconductor die of predetermined first lateral size and shape in a stacked relationship, comprising:
    a hollow tube having a longitudinal bore of predetermined second lateral size and shape larger than said first lateral size and shape, said bore having an interior surface;
    at least six longitudinal metallic rails spaced around said bore and protruding from said interior surface into said bore to form a longitudinal cage of internal third lateral size and shape larger than said die, for guiding and aligning said semiconductor die in a stacked relationship within said bore, and wherein said longitudinal metallic rails comprise bent-over portions which mate with notches in said interior bore adapted to retain said metallic rails in said interior bore.

2. The die carrier of claim 1 further comprising end closure means at each end of said bore for retaining said semiconductor die within said bore, at least one of said end closure means comprising a removeable cap and ring wherein said ring can be retained on said hollow tube when said cap is removed.

3. The die carrier of claim 1 further comprising fill indicator means for ascertaining the presence or absence of varying numbers of semiconductor die within said hollow tube, wherein said fill indicator means comprises a light transmitting region having a substantially smooth outer surface located in a first portion of a sidewall of said hollow tube, and wherein said substantially smooth outer surface of said light transmitting region is relieved below a second portion of said sidewall.

* * * * *